United States Patent
Uno et al.

(10) Patent No.: US 11,888,462 B2
(45) Date of Patent: Jan. 30, 2024

(54) BONDED BODY AND ACOUSTIC WAVE ELEMENT

(71) Applicant: NGK INSULATORS, LTD., Nagoya (JP)

(72) Inventors: Yudai Uno, Nagoya (JP); Masashi Goto, Nagoya (JP); Tomoyoshi Tai, Inazawa (JP)

(73) Assignee: NGK INSULATORS, LTD., Nagoya (JP)

( * ) Notice: Subject to any disclaimer, the term of this patent is extended or adjusted under 35 U.S.C. 154(b) by 460 days.

(21) Appl. No.: 17/231,429

(22) Filed: Apr. 15, 2021

(65) Prior Publication Data

US 2021/0234530 A1    Jul. 29, 2021

Related U.S. Application Data

(63) Continuation of application No. PCT/JP2019/033130, filed on Aug. 23, 2019.

(30) Foreign Application Priority Data

Oct. 17, 2018    (JP) ................................ 2018-195663

(51) Int. Cl.
*H03H 9/02*    (2006.01)
*H03H 3/08*    (2006.01)

(52) U.S. Cl.
CPC .......... *H03H 9/02574* (2013.01); *H03H 3/08* (2013.01); *H03H 9/02559* (2013.01)

(58) Field of Classification Search
CPC .. H03H 9/02574; H03H 3/08; H03H 9/02559; H03H 9/14541; H03H 9/25; H10N 30/073

(Continued)

(56) References Cited

U.S. PATENT DOCUMENTS 7,213,314 B2    5/2007    Abbott et al.
10,284,169 B2 *    5/2019    Goto ................... H03H 9/02574

(Continued)

FOREIGN PATENT DOCUMENTS

JP    3774782 B2    12/2004
JP    2004343359 A    12/2004

(Continued)

OTHER PUBLICATIONS

English Translation of the International Preliminary Report on Patentability, issued in corresponding International Application No. PCT/JP2019/033130 dated Apr. 29, 2021 (7 pages).

(Continued)

*Primary Examiner* — Rakesh B Patel
*Assistant Examiner* — Jorge L Salazar, Jr.
(74) *Attorney, Agent, or Firm* — FLYNN THIEL, P.C.

(57) ABSTRACT

A bonded body includes a supporting substrate; a piezoelectric material substrate; a first bonding layer provided on the supporting substrate and having a composition of $Si_{(1-x)}O_x$ ($0.008 \leq x \leq 0.408$); a second bonding layer provided on the piezoelectric material substrate and having a composition of $Si_{(1-y)}O_y$ ($0.008 \leq y \leq 0.408$); and an amorphous layer provided between the first bonding layer and second bonding layer. The oxygen ratio of the amorphous layer is higher than the oxygen ratio of the first bonding layer and oxygen ratio of the second bonding layer.

9 Claims, 6 Drawing Sheets

(58) Field of Classification Search
USPC .......................................... 333/133, 193–196
See application file for complete search history.

(56) References Cited

U.S. PATENT DOCUMENTS

| | | |
|---|---|---|
| 2004/0226162 A1 | 11/2004 | Miura et al. |
| 2012/0086312 A1 | 4/2012 | Kobayashi et al. |
| 2019/0007022 A1 | 1/2019 | Goto et al. |
| 2019/0036505 A1 | 1/2019 | Akiyama et al. |

FOREIGN PATENT DOCUMENTS

| | | |
|---|---|---|
| JP | 5814727 B2 | 4/2012 |
| JP | 201486400 A | 5/2014 |
| WO | 2017134980 A1 | 8/2017 |
| WO | 2018180827 A1 | 10/2018 |

OTHER PUBLICATIONS

International Search Report with English Translation issued in corresponding International Application No. PCT/JP2019/033130 dated Oct. 1, 2019 (5 pages).

Written Opinion of International Searching Authority issued in corresponding International Application No. PCT/JP2019/033130 dated Oct. 1, 2019 (4 pages).

\* cited by examiner

BONDED BODY AND ACOUSTIC WAVE ELEMENT

CROSS-REFERENCE TO RELATED APPLICATIONS

This is a continuation of PCT/JP2019/033130, filed Aug. 23, 2019, which claims priority to Japanese Application No. JP2018-195663 filed on Oct. 17, 2018, the entire contents of which are hereby incorporated by reference.

TECHNICAL FIELD

The present invention relates to a bonded body of a piezoelectric material substrate and a supporting substrate, and an acoustic wave element.

BACKGROUND ARTS

It is known a surface acoustic wave device functioning as a filter device or oscillator used in mobile phones or the like and an acoustic wave device such as lamb wave device or film bulk acoustic resonator (FBAR) using a piezoelectric thin film. As such acoustic wave device, it is known a device produced by adhering a supporting body and a piezoelectric substrate propagating a surface acoustic wave and by providing interdigitated electrodes capable of oscillating the surface acoustic wave on a surface of the piezoelectric substrate. By adhering the supporting body whose thermal expansion coefficient is lower than that of the piezoelectric substrate onto the piezoelectric substrate, the change of a size of the piezoelectric substrate responsive to temperature change is reduced so that the change of the frequency characteristics as the surface acoustic wave device is reduced.

When a piezoelectric substrate and silicon substrate are bonded with each other, it is known that a silicon oxide film is formed on the surface of the piezoelectric substrate and that the piezoelectric substrate and silicon substrate are directly bonded with each other through the silicon oxide film (patent document 1). During the bonding, plasma beam is irradiated onto the surfaces of the silicon oxide film and of the silicon substrate to activate the surfaces and the direct bonding is performed (plasma activation method).

Further, it is known that the surface of the piezoelectric substrate is made a rough surface, that a filler layer is provided on the rough surface to flatten it and that the filler layer is adhered onto the silicon substrate through an adhesive layer (patent document 2). According to the method, epoxy series or acrylic series resin is used for the filler and adhesive layers and the bonding face of the piezoelectric substrate is made the rough surface, so that the reflection of bulk wave is suppressed and spurious is reduced.

It is further known direct bonding method according to so-called FAB (Fast Atom Beam System (patent document 3). According to the method, neutralized atomic beam is irradiated onto the respective bonding faces at ambient temperature to activate them, which are directly bonded with each other.

On the other hand, according to patent document 4, it is described that a piezoelectric material substrate is directly bonded with a supporting substrate composed of a ceramic material (alumina, aluminum nitride, silicon nitride) through an intermediate layer instead of a silicon substrate. The material of the intermediate layer is made silicon, silicon oxide, silicon nitride or aluminum nitride.

PATENT DOCUMENT (Patent document 1) U.S. Pat. No. 7,213,314 B2
(Patent document 2) Japanese Patent No. 5,814,727B
(Patent document 3) Japanese Patent Publication No. 2014-086400A
(Patent document 4) Japanese Patent No. 3,774,782B
(Patent document 5) PCT/JP2018/011256

SUMMARY OF THE INVENTION

It is desired to improve the electrical resistance of a bonding layer to increase the insulation property, depending on applications of a bonded body. For example, in the case of acoustic wave elements, noise or loss can be reduced by improving the insulation property of the bonding layer. Thus, the applicant disclosed that the composition of the bonding layer is made silicon oxide having a lower oxygen ratio to form the bonding layer with the improved insulation property (Patent document 5).

However, it may be difficult to bond a piezoelectric material substrate strongly and stably onto a supporting substrate through the bonding layer composed of the silicon oxide having the low oxygen ratio. Separation may occur when the piezoelectric material substrate is subjected to a processing such as polishing.

An object of the present invention is to bond a piezoelectric material substrate strongly and stably onto a supporting substrate through a bonding layer composed of silicon oxide having a low oxygen ratio.

Solution for the Object

The present invention provides a bonded body comprising:
a supporting substrate;
a piezoelectric material substrate;
a first bonding layer provided on the supporting substrate and having a composition of $Si_{(1-x)}O_x$ (0.008≤x≤0.408);
a second bonding layer provided on the piezoelectric material substrate and having a composition of $Si_{(1-y)}O_y$ (0.008≤y≤0.408); and
an amorphous layer provided between the first bonding layer and the second bonding layer,
wherein an oxygen ratio of the amorphous layer is higher than an oxygen ratio of the first bonding layer and an oxygen ratio of the second bonding layer.

The present invention further provides an acoustic wave device comprising:
said bonded body; and
an electrode provided on said piezoelectric material substrate.

According to the present invention, the piezoelectric material substrate can be bonded strongly and stably onto the supporting substrate through the bonding layer composed of silicon oxide having the low oxygen ratio.

MODES FOR CARRYING OUT THE INVENTION

Figure 1A:
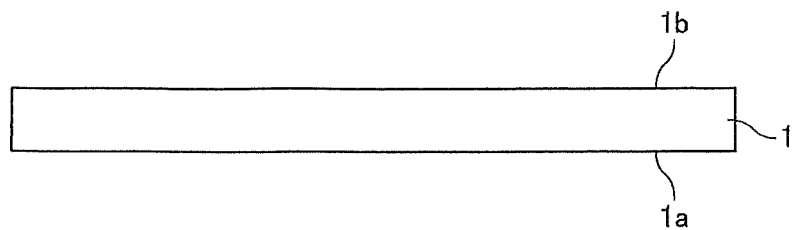
FIG. 1(a) shows a piezoelectric material substrate 1.

The present invention will be described in detail below, appropriately referring to the drawings.

Figure 1B:
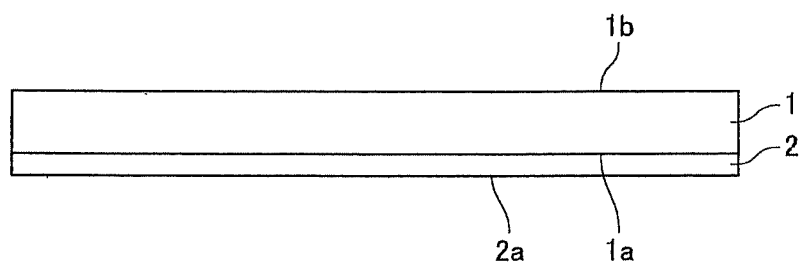
FIG. 1(b) shows the state that a second bonding layer 2 is provided on the piezoelectric material substrate 1.
Figure 1C:
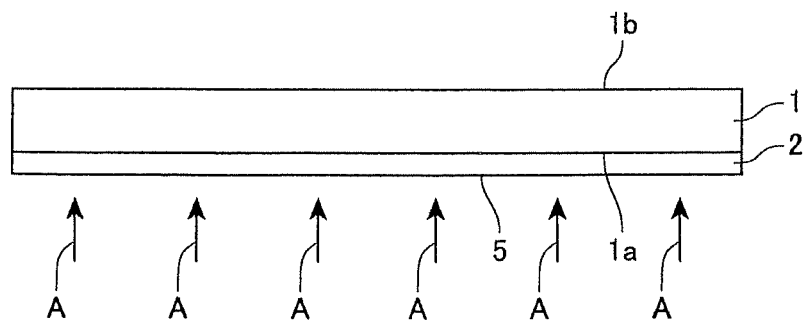
FIG. 1(c) shows the state that a surface 2a of the second bonding layer 2 is activated by neutralized beam A to provide an activated surface 5.

As shown in FIG. 1(a), a piezoelectric material substrate 1 includes a pair of min faces 1a and 1b. As shown in FIG. 1(b), a second bonding layer 2 is film formed on the main face 1a of the piezoelectric material substrate 1. Then, as shown in FIG. 1(c), neutralized beam is irradiated onto a surface 2a of the bonding layer 2 as an arrow A to activate the surface 2a of the bonding layer 2 to provide an activated surface 5.

Figure 2A:
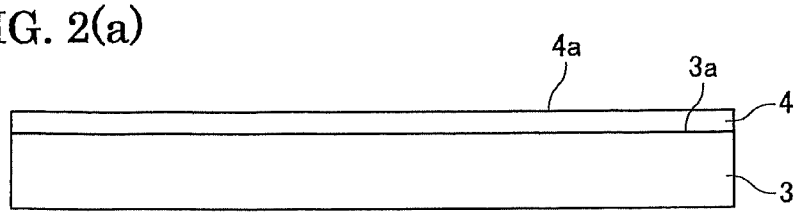
FIG. 2(a) shows the state that a first bonding layer 4 is provided on a supporting substrate 3.
Figure 2B:
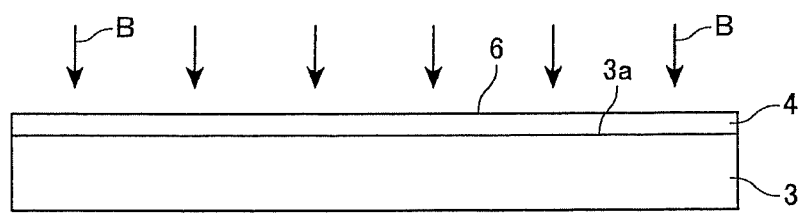
FIG. 2(b) shows the state that a surface 4a of the first bonding layer 4 is activated by neutralized beam B to provide an activated surface 6.

Further, as shown in FIG. 2(a), a first bonding layer 4 is film formed on a main face 3a of a supporting substrate 3. Then, as shown in FIG. 2(b), neutralized beam is irradiated onto a surface 4a of the bonding layer 4 as an arrow B to activate the surface 4a of the bonding layer 4 to provide an activated surface 6.

Figure 3A:
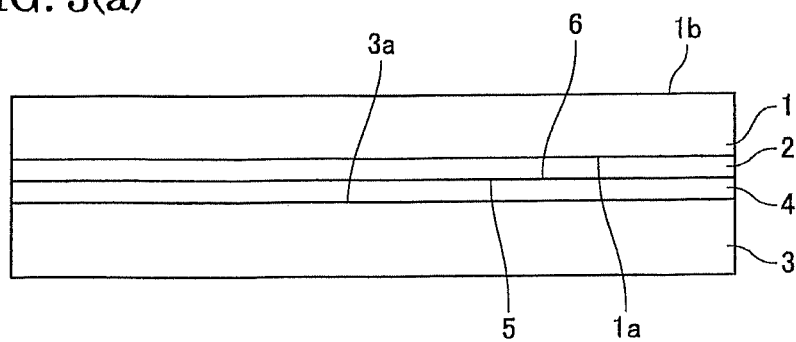
FIG. 3(a) shows the state that the first bonding layer 4 and second bonding layer 2 are contacted with each other.
Figure 3B:
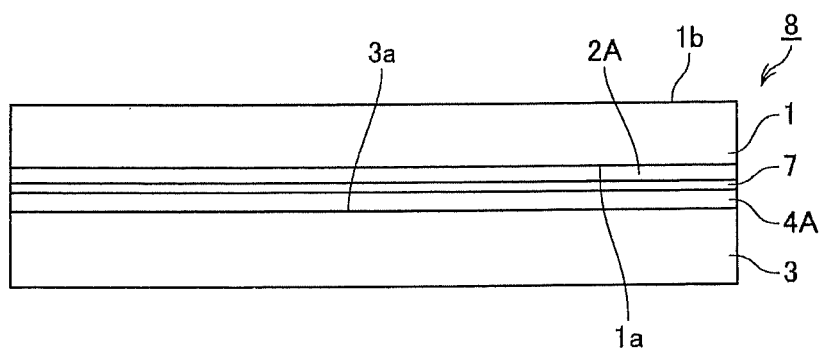
FIG. 3(b) shows the state that the first bonding layer 4A and second bonding layer 2A are bonded with each other to produce a bonded body 8.

Then, as shown in FIG. 3(a), the activated surface 6 of the first bonding layer 4 and activated surface 5 of the second bonding layer 2 are directly contacted with each other under pressure to obtain a bonded body 8, as shown on FIG. 3(b). Here, the output powers, irradiation times or the like of the neutralized beams A and B can be controlled to generate an amorphous layer 7 along an interface between the activated surface 6 of the first bonding layer 4 and the activated surface 5 of the second bonding layer 2. As shown in FIG. 3(b), the amorphous layer 7 is thereby generated along the interface between the first bonding layer 4A ands second bonding layer 2A.

Figure 4A:
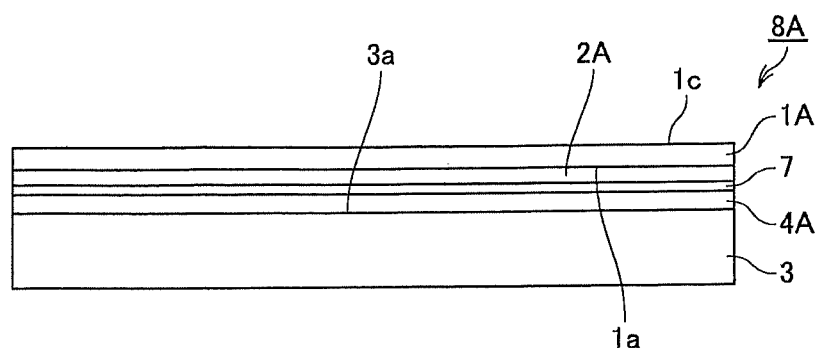
FIG. 4(a) shows the state that a piezoelectric material substrate 1A is thinned by processing.

According to a preferred embodiment, a surface 1b of the piezoelectric material substrate 1 of the bonded body 8 is further subjected to polishing treatment to thin the piezoelectric material substrate 1A as shown in FIG. 4(a), to provide a bonded body 8A. 4c represents a polished face.

Figure 4B:
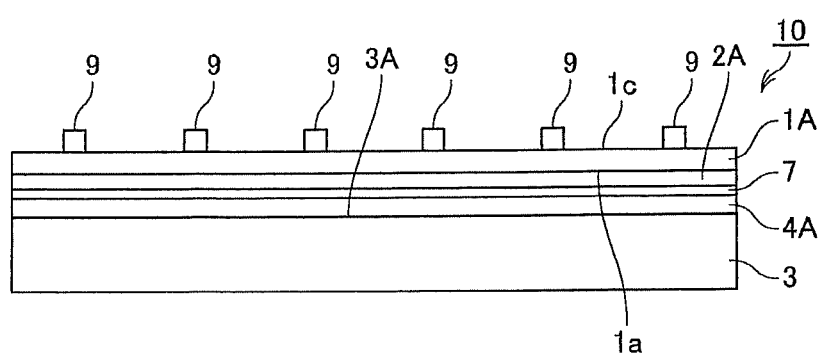
FIG. 4(b) shows the state that electrodes 9 are provided on a piezoelectric material substrate 1A.

As shown in FIG. 4(b), predetermined electrodes 9 are formed on the polished face 1c of the piezoelectric material substrate 1A to produce an acoustic wave element 10.

Figure 5A:
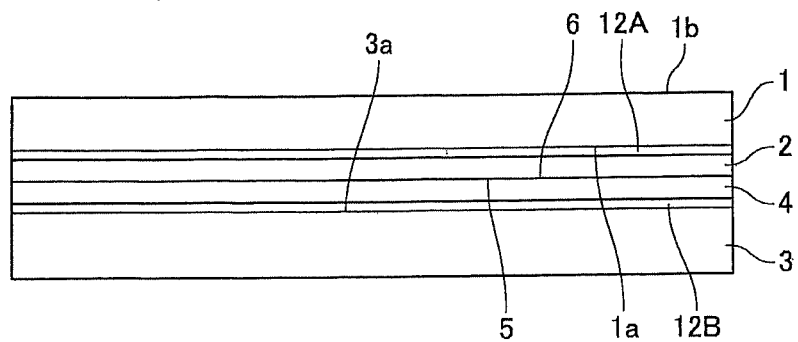
FIG. 5(a) shows the state that the first bonding layer 4 and second bonding layer 2 are contacted with each other.
Figure 5B:
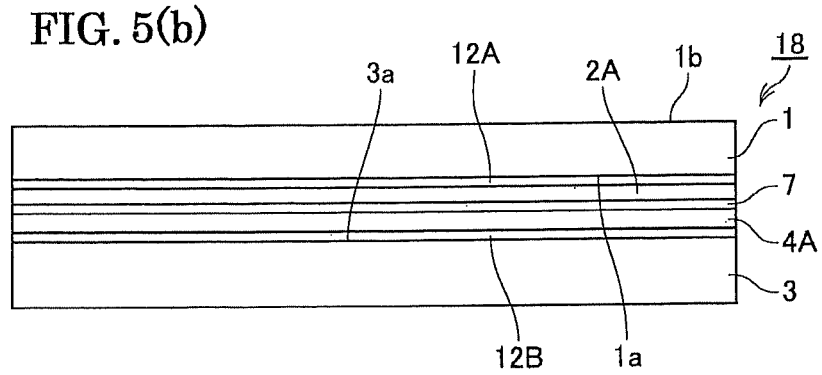
FIG. 5(b) shows the state that the first bonding layer 4A and second bonding layer 2A are bonded with each other to produce a bonded body 18.
Figure 6A:
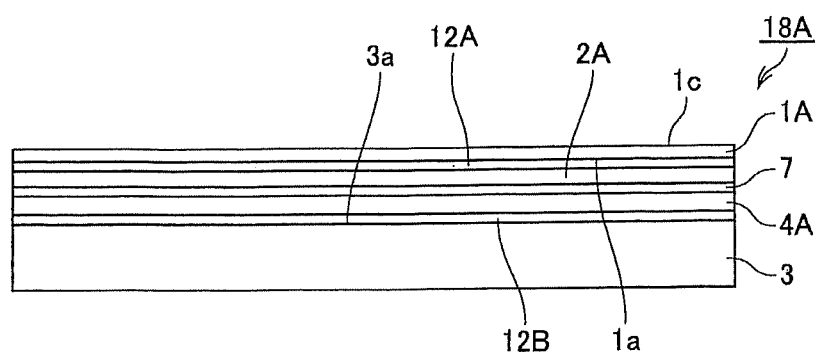
FIG. 6(a) shows the state that the piezoelectric material substrate 1A is thinned by processing.

According to an embodiment shown in FIGS. 5 and 6, an intermediate layer 12A is provided between the piezoelectric material substrate 1 and second bonding layer 2, and an intermediate layer 12B is provided between the supporting substrate 3 and first bonding layer 4.

That is, as shown in FIG. 5(a), the intermediate layer 12A and second bonding layer 2 are film-formed in the order on the main face 1a of the piezoelectric material substrate 1. Then, neutralized beam is irradiated onto the surface of the bonding layer 2 to activate the surface of the bonding layer 2A to provide the activated surface 5. The intermediate layer 12B and first bonding layer 4 are film-formed in the order on the main surface 3a of the supporting substrate 3. Then, the neutralized beams are irradiated onto the respective surfaces of the bonding layers 2 and 4 to activate the respective surfaces of the respective bonding layers to provide activated surfaces 6 and 5.

Then, as shown in FIG. 5(a), the activated surface 6 of the first bonding layer 4 and activated surface 5 of the second bonding layer 2 are directly contacted with each other under pressure, to obtain a bonded body 18, as shown in FIG. 5(b). Here, the output powers and irradiation times of the neutralized beams A and B are controlled so that an amorphous layer 7 can be generated along the bonding interface between the activated surface 6 of the first bonding layer 4 and activated surface 5 of the second bonding layer 2. The amorphous layer 7 is thereby generated along the interface between the first bonding layer 4A and second bonding layer 2A, as shown in FIG. 5(b).

Figure 6B:
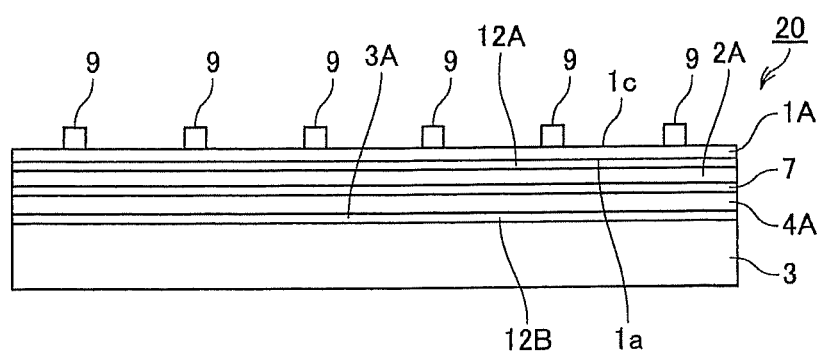
FIG. 6(b) shows the state that electrodes 9 are provided on the piezoelectric material substrate 1A.

According to a preferred embodiment, the surface 1b of the piezoelectric material substrate 1 of the bonded body 18 is further subjected to polishing to make the thickness of the piezoelectric material substrate 1A smaller as shown in FIG. 6(b), to obtain a bonded body 18A. 1c represents a polished surface.

According to FIG. 6(b), predetermined electrodes 9 are formed on the polished surface 1c of the piezoelectric material substrate 1A, to produce an acoustic wave device 20.

According to the present invention, the supporting substrate may be composed of a monocrystalline or polycrystalline material. The material of the supporting substrate may preferably be selected from the group consisting of silicon, sialon, sapphire cordierite, mullite and alumina. The alumina may preferably be translucent alumina.

The relative density of the supporting substrate may preferably be 95.5 percent or higher and may be 100 percent, on the viewpoint of the bonding strength. The relative density is measured by Archimedes method. Further, although the method of producing the supporting substrate is not particularly limited, the method may preferably be sintering method.

Silicon may be monocrystalline silicon, polycrystalline silicon or high-resistance silicon.

Sialon is a ceramic material obtained by sintering mixture of silicon nitride and alumina and has the following composition.

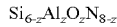

$Si_{6-z}Al_zO_zN_{8-z}$

That is, sialon has the composition of mixed alumina with silicon nitride, and z indicates the ratio of mixed alumina. Z may more preferably be 0.5 or more. Further, z may more preferably be 4.0 or less.

Sapphire is a single crystal having the composition of $Al_2O_3$, and alumina is a polycrystal having the composition of $Al_2O_3$. Cordierite is ceramics having the composition of $2MgO \cdot 2Al_2O_3 \cdot 5SiO_2$. Mullite is ceramics having the composition in a range of $3Al_2O_3 \cdot 2SiO_2$ to $2Al_2O_3 \cdot SiO_2$.

Although the material of the piezoelectric material substrate is not limited as far as it has necessary piezoelectricity, the material may preferably be a single crystal having the composition of $LiAO_3$. Here, A represents one or more elements selected from the group consisting of niobium and tantalum. Thus, $LiAO_3$ may be lithium niobate, lithium tantalate or lithium niobate-lithium tantalate solid solution.

According to the present invention, the first bonding layer is provided on the supporting substrate and second bonding layer is provided on the piezoelectric material substrate. The first bonding layer has a composition of $Si_{(1-x)}O_x$ (0.008≤x≤0.408), and the second bonding layer has a composition of $Si_{(1-y)}O_y$ (0.008≤y≤0.408).

The composition is a composition whose oxygen concentration is considerably lower than that of $SiO_2$ (corresponding to x=0.667). The insulting property of each of the bonding layers can be made high, by bonding the piezoelectric material substrate onto the supporting substrate through the first bonding layer having the silicon oxide with the composition of $Si_{(1-x)}O_x$ and through the second bonding layer having the silicon oxide with the composition of $Si_{(1-y)}O_y$ (0.008≤y≤0.408).

In the case that x or y is lower than 0.008 in the composition of $Si_{(1-x)}O_x$ or in the composition of $Si_{(1-y)}O_y$ forming the respective bonding layers, the electrical resistances of the bonding layers are low and desired insulating property cannot be obtained. Thus, x and y are made 0.008 or higher, and x and y may preferably be 0.010 or higher, more preferably be 0.020 or higher, and most preferably be 0.024 or higher. Further, in the case that x and y are higher than 0.408, the bonding strength is lowered so that the separation of the piezoelectric material substrate tends to occur. X and y are thus made 0.408 or lower, and may preferably made 0.225 or lower.

The electrical resistances of the respective bonding layers may preferably be $4.8 \times 10^3$ Ω·cm or higher, more preferably be $5.8 \times 10^3$ Ω·cm or higher and most preferably be $6.2 \times 10^3$ Ω·cm or higher. Further, the electrical resistances of the bonding layers are generally $1.0 \times 10^8$ Ω·cm or lower.

Although the thickness of each bonding layer is not particularly limited, they may preferably be 0.01 to 10 μm and more preferably be 0.01 to 0.5 μm, on the viewpoint of production cost.

Although the film-forming method of the respective bonding layers is not particularly limited, sputtering method, chemical vapor deposition (CVD) method and vapor deposition method may be listed. Here, particularly preferably, during reactive sputtering using a sputtering target of Si, the amount of oxygen gas flown into a chamber is adjusted so that the oxygen ratios (x) in the respective bonding layers can be controlled.

Although specific conditions for producing the respective bonding layers are appropriately selected depending on the specification of the chamber, according to a preferred example, the total pressure is made 0.28 to 0.34 Pa, the partial pressure of oxygen is made $1.2 \times 10^{-3}$ to $5.7 \times 10^{-2}$ Pa and the film-forming temperature is made ambient temperature. Further, Si doped with B is exemplified as the Si target. As described later, the amount of B (boron) as an impurity is controlled at about $5 \times 10^{18}$ atoms/$cm^3$ to $5 \times 10^{19}$ atoms/$cm^3$ at an interface between the first bonding layer and second bonding layer. It is thereby possible to obtain the insulation property of each bonding layer more assuredly.

According to the present invention, the activated surface of the first bonding layer and activated surface of the second bonding layer are directly bonded with each other. In other words, the bonding interface is present along the interface between the first and second bonding layers. In this case, the arithmetic average roughness Ra of each activated surface of each bonding layer may preferably be 1 nm or lower and more preferably be 0.3 nm or lower. The bonding strength is thereby further improved.

The bonded body of the present invention further includes an amorphous layer generated between the first and second bonding layers. The oxygen ratio of the amorphous layer is higher than the oxygen ratios of the first bonding layer and second bonding layer. That is, the amorphous layer is generated along the activated surface of the supporting substrate, and as the diffusion of oxygen is progressed in the amorphous layer formed between them, it is found that the oxygen ratio of the amorphous layer may become higher than the oxygen ratio of the first bonding layer and higher than the oxygen ratio of the second bonding layer. In addition to this, in the case that the diffusion of oxygen is progressed as such, it is found that the bonding strength of the piezoelectric material substrate to the supporting substrate may become high and, for example, even when the piezoelectric material substrate is thinned by the processing, the separation of the piezoelectric material substrate is suppressed.

According to a preferred embodiment, the difference of the oxygen ratios of the amorphous layer and of the first bonding layer and the difference of the oxygen ratios of the amorphous layer and of the second bonding layer may preferably be 0.5 atom % or larger, respectively. The differences may more preferably be 1.0 atom % or larger. Although the upper limit of the difference of the oxygen ratios of the amorphous layer and of the first bonding layer or of the difference of the oxygen ratios of the amorphous layer and of the second bonding layer is not particularly defined, it may actually and preferably be 5.0 atom % or lower and more preferably be 4.5 atom % or lower.

According to a preferred embodiment, the argon ratio of the amorphous layer is higher than the argon ratio of the first bonding layer and argon ratio of the second bonding layer. According to such microstructure in which the diffusion of argon is facilitated from the respective bonding layers into the intermediate amorphous layer, the bonding strength is further improved.

On the viewpoint, the difference of the argon ratios of the amorphous layer and of the first bonding layer and the difference of the argon ratios of the amorphous layer and of the second bonding layer may preferably be 1.0 atom % or higher and more preferably be 1.5 atom % or higher. Although the upper limit of the difference of the argon ratios of the amorphous layer and of the first bonding layer or of the difference of the oxygen ratios of the amorphous layer and of the second bonding layer is not particularly defined, it may actually and preferably be 5.0 atom % or lower and more preferably be 4.5 atom % or lower.

According to a preferred embodiment, the composition of the amorphous layer contains silicon (Si), oxygen (O) and argon (Ar) as main components. "Main components" means that a total of the atomic ratios of these atoms is 95 atom % or higher and may more preferably be 97 atom % or higher provided that 100 atom % is assigned to a total atomic ratio. More preferably, the composition of the amorphous layer is $Si_{(1-t)}O_t$ (0.013≤t≤0.408), and the oxygen ratio is higher than those of the first and second bonding layers and the composition includes argon.

Although the material of the intermediate layer between the supporting substrate and first bonding layer or between the piezoelectric material substrate and second bonding layer is not particularly limited as far as it is capable of bonding with them, the material may preferably be $SiO_2$, $Ta_2O_5$, $TiO_2$, $ZrO_2$, $HfO_2$, $Nb_2O_3$, $Bi_2O_3$, $Al_2O_3$, MgO, AlN or $Si_3N_4$.

Particularly, in an application for high frequency (frequency band for 5G communication in 3.5 to 6 GHz, or the like), it is necessary to improve the frequency of an acoustic wave, and in this case, the respective materials of the intermediate layer between the supporting substrate and first bonding layer and of the intermediate layer between the piezoelectric material substrate and second bonding layer may preferably be high sound velocity materials. The sound velocity of such high-sound velocity material may preferably be 6000 m/s or higher and more preferably be 10000 m/s or higher. Although the sound velocity of the material of each intermediate layer is not particularly limited, it is difficult to exceed 30000 m/s on practical viewpoint, and it may be 30000 m/s or lower, and 25000 m/s or lower, in many times. Such high-sound velocity material includes AlN and $Si_3N_4$. Further, the sound velocity of the material is to be calculated based on the density measured by JIS method (JIS C2141), Young's modulus (JIS R1602) and Poisson ratio (JIS R1602).

Further, in the application for high frequency (application for frequency band for 5G communication of 3.5 to 6 GHz or the like), as a signal of a high power is input, it is necessary to improve the heat dissipation property. In this case, it is preferred that the materials of the intermediate layers between the supporting substrate and first bonding layer and between the piezoelectric material substrate and second bonding layer are made high thermal conduction materials. The thermal conductivity of such high thermal conduction material may preferably be 100 W/(m·K) or higher, more preferably be 900 W/(m·K) or higher and most preferably be 1000 W/(m·K) or higher. Although the upper limit of the thermal conductivity of the material of each intermediate layer is not particularly defined, as it is difficult to exceed 5000 W/(m·K) on practical viewpoint, it may be 5000 W/(m·K) or lower and further 3000 W/(m·K) or lower in many cases. Such high thermal conduction material includes AlN and $Si_3N_4$. Further, the thermal conductivity of the material is to be measured according to JIS R1611.

Respective constituents of the present invention will be described further in detail below.

The application of the bonded body of the present invention is not particularly limited, and it may preferably be applied as an acoustic wave device or optical device.

As the acoustic wave device, a surface acoustic wave device, Lamb wave-type device, thin film resonator (FBAR) or the like is known. For example, the surface acoustic wave device is produced by providing input side IDT (Interdigital transducer) electrodes (also referred to as comb electrodes or interdigitated electrodes) for oscillating surface acoustic wave and IDT electrodes on the output side for receiving the surface acoustic wave on the surface of the piezoelectric single crystal substrate. By applying high frequency signal on the IDT electrodes on the input side, electric field is generated between the electrodes, so that the surface acoustic wave is oscillated and propagated on the piezoelectric substrate. Then, the propagated surface acoustic wave is drawn as an electrical signal from the IDT electrodes on the output side provided in the direction of the propagation.

A metal film may be provided on a bottom surface of the piezoelectric material substrate. After the Lamb type device is produced as the acoustic wave device, the metal film plays a role of improving the electro-mechanical coupling factor near the bottom surface of the piezoelectric substrate. In this case, the Lamb type device has the structure that interdigitated electrodes are formed on the surface of the piezoelectric material, substrate and that the metal film on the piezoelectric material substrate is exposed through a cavity provided in the supporting body. Materials of such metal films include aluminum, an aluminum alloy, copper, gold or the like, for example. Further, in the case that the Lamb wave type device is produced, it may be used a composite substrate having the piezoelectric single crystal substrate without the metal film on the bottom surface.

Further, a metal film and an insulating film may be provided on the bottom surface of the piezoelectric material substrate. The metal film plays a role of electrodes in the case that the thin film resonator is produced as the acoustic wave device. In this case, the thin film resonator has the structure that electrodes are formed on the upper and bottom surfaces of the piezoelectric material substrate and the insulating film is made a cavity to expose the metal film on the piezoelectric material substrate. Materials of such metal films include molybdenum, ruthenium, tungsten, chromium, aluminum or the like, for example. Further, materials of the insulating films include silicon dioxide, phosphorus silicate glass, boron phosphorus silicate glass or the like.

Further, as the optical device, it may be listed an optical switching device, wavelength conversion device and optical modulating device. Further, a periodic domain inversion structure may be formed in the piezoelectric material substrate.

In the case that the object of the present invention is an acoustic wave device and that the piezoelectric material substrate is made of lithium tantalate, it is preferred to use the substrate rotated from Y-axis to Z-axis by 36 to 47° (for example 42°) around X-axis, which is a direction of propagation of a surface acoustic wave, because of a low propagation loss.

Further, in the case that the piezoelectric material substrate is made of lithium niobate, it is preferred to use the substrate rotated from Y-axis to Z-axis by 60 to 68° (for example 64°) around X-axis, which is the direction of propagation of the surface acoustic wave, because of a lower propagation loss. Further, although the size of the piezoelectric material substrate is not particularly limited, for example, the diameter may be 50 to 150 mm and thickness may be 0.2 to 60 μm.

The following method is preferred to obtain the inventive bonded body.

First, the respective surfaces of the respective bonding layers are flattened to obtain flat surfaces. Here, the method of flattening the respective surfaces includes lapping, chemical mechanical polishing (CMP) and the like. Further, the flat surfaces may preferably have Ra of 1 nm or lower and more preferably be 0.3 nm or lower.

Then, for removing the residue of a polishing agent and processing denatured layer, the respective surfaces of the respective bonding layers are cleaned. The method of cleaning the surfaces includes wet cleaning, dry cleaning, scrub cleaning or the like, and the scrub cleaning is preferred on the viewpoint of obtaining cleaned surface simply and effectively. At this time, it is particularly preferred to use "Sun Wash LH540" as the cleaning agent and then to perform the cleaning by means of a scrub cleaning machine using mixed solution of acetone and IPA.

Then, neutralized beam is irradiated onto the respective surfaces of the respective bonding layers to activate the respective surfaces.

When the activation of the surfaces is performed using the neutralized beam, it is preferred to use a system described in Patent Document 3 to generate the neutralized beam, which is irradiated. That is, it is used a high-speed atomic beam source of saddle field type as the beam source. Then, inert gas is introduced into the chamber and a high voltage is applied onto electrodes from a direct current electric source. By this, electric field of saddle field type generated between the electrode (positive electrode) and a housing (negative electrode) causes motion of electrons, e, so that atomic and ion beams derived from the inert gas are generated. Among the beams reached at a grid, the ion beam is neutralized at the grid, and the beam of neutral atoms is emitted from the high-speed atomic beam source. The atomic specie providing the beam may preferably be an inert gas (argon, nitrogen or the like).

In the activation step by beam irradiation, the voltage may preferably be made 0.5 to 2.0 kV, and the current may preferably be made 50 to 200 mA.

Then, the activated surfaces are contacted and bonded with each other under vacuum atmosphere. The temperature at this time may be ambient temperature, specifically 40° C. or lower and more preferably 30° C. or lower. Further, the temperature during the bonding may more preferably be 20° C. or higher and 25° C. or lower. The pressure at the bonding is preferably 100 to 20000N.

EXAMPLES

Inventive Examples 1, 2, 3 and 3-2, Comparative Example 1 and 2

It was produced the bonded bodies 8 and 8A of the respective examples shown in tables 1 and 2, according to the method described referring to FIGS. 1 and 2.

Specifically, it was used a lithium tantalate substrate (LT substrate) having an OF part, a diameter of 4 inches and a thickness of 250 μm as the piezoelectric single crystal substrate 1. It was used a 46° Y-cut X-propagation LT substrate in which the propagation direction of surface acoustic wave (SAW) was made X and the cutting angle was of rotated Y-cut plate, as the LT substrate. The surface 1a of the piezoelectric material substrate 1 was subjected to mirror surface polishing so that the arithmetic average roughness Ra reached 0.3 nm. Further, Ra was measured by an atomic force microscope (AFM) in a visual field of 10 μm×10 μm.

Then, the bonding layer 2 was film-formed on the surface 1a of the piezoelectric material substrate 1 by direct current sputtering method. Si doped with boron was used as a target. Further, oxygen gas was introduced as an oxygen source. At this time, the amount of the introduced oxygen gas was changed to change the total pressure of atmosphere and partial pressure of oxygen in a chamber, so that the oxygen ratio in the bonding layer 2 was changed. The thickness of the bonding layer 2 was made 100 to 200 nm. The arithmetic average roughness Ra of the surface 2a of the bonding layer 2 was 0.2 to 0.6 nm. Then, the bonding layer 2 was subjected to chemical mechanical polishing (CMP) so that the film thickness was made 80 to 190 nm and Ra was made 0.08 to 0.4 nm.

Further, as the supporting substrate 3, it was prepared the supporting substrate 3 composed of silicon and having the orientation flat (OF) part, a diameter of 4 inches and a thickness of 500 μm. The surfaces of the supporting substrate 3 were finished by chemical mechanical polishing (CMP) so that each arithmetic average roughness Ra reached 0.2 nm.

Then, the bonding layer 4 was film-formed on the surface 3a of the supporting substrate 3 by direct current sputtering method. Si doped with boron was used as a target. Further, oxygen gas was introduced as an oxygen source. At this time, the amount of the introduced oxygen gas was changed to change the total pressure of atmosphere and partial pressure of oxygen in a chamber, so that the oxygen ratio in the bonding layer 4 was changed. The thickness of the bonding layer 4 was made 100 to 200 nm. The arithmetic average roughness Ra of the surface 4a of the bonding layer 4 was 0.2 to 0.6 nm. Then, the bonding layer 2 was subjected to chemical mechanical polishing (CMP) so that the film thickness was made 80 to 190 nm and Ra was made 0.08 to 0.4 nm.

Then, the surface of the bonding layer 4 and surface of the bonding layer 4 were cleaned to remove the contamination, followed by introduction into a vacuum chamber. After it was evacuated to the order of $10^{-6}$ Pa, high-speed atomic beam (acceleration voltage of 1 kV and Ar flow rate of 27 sccm) was irradiated onto the surfaces over 120 sec. Then, after the beam-irradiated surface (activated surface) 5 of the bonding layer 2 and activated surface 6 of the bonding layer 4 were contacted with each other, The substrates were bonded by pressurizing at 10000N for 2 minutes (refer to FIG. 3(b)). Then, the thus obtained bonded bodies 8 of the respective examples were heated at 100° C. for 20 hours.

The surface of the piezoelectric material substrate 1 was then subjected to grinding and polishing so that the thickness was changed from the initial 250 μm to 1 μm (refer to FIG. 4(a)).

The following characteristics were evaluated for the thus obtained bonded bodies 8 and 8A of the respective examples.

(Confirmation of Amorphous Layer)

The presence of the amorphous layer was observed as follows.

Measuring System:

The microstructure was observed using a transmission-type electron microscope "H-9500" supplied by Hitachi High-Tech Corporation.

Measuring Condition:

A sample of a thinned piece was observed by FIB (Focused Ion Beam method) at an accelerating voltage of 200 kV.

(Ratios of Atoms in First Bonding Layer, Amorphous Layer and Second Bonding Layer)

The elementary analysis was performed by EDS (energy dispersed type X-ray spectrometer) using the following system to measure the ratios of oxygen atoms and argon atoms in the bonding layers and amorphous layer.

Measuring System:

Elementary analysis was performed by using an elementary analysis system "JEM-ARM200F" supplied by JEOL Ltd.

Measurement Conditions:

A sample of a thinned piece was observed by FIB (Focused Ion Beam method) at an accelerating voltage of 200 kV.

(Bonding Strength)

The bonding strengths of the bonded bodies 8 and 8A of the respective examples were measured by crack opening method. Further, in the case that the bonding strength exceeds 1.75 J/m², the separation near the bonding layers did not occur and the bonded bodies 8 and 8A were broken in bulk fracture.

TABLE 1

|  |  | Comparative Example 1 |  |  | Comparative Example 2 |  |  |
|---|---|---|---|---|---|---|---|
| Piezoelectric material substrate |  | Lithium tantalate |  |  | Lithium tantalate |  |  |
| Supporting substrate |  | Si |  |  | Si |  |  |
| FAB irradiation amount (kJ) |  | 45 |  |  | 22.5 |  |  |
| Bonding strength (J/m2) |  | 0.7 |  |  | 0.3 |  |  |
|  |  | Si | O | Ar | Si | O | Ar |
| Ratio of atoms atom % | Bonding layer on the side of piezoelectric material substrate | 94.3 | 5.4 | 0.3 | 93.8 | 6.0 | 0.2 |
|  | Amorphous | 93.6 | 5.4 | 1.0 | 93.6 | 5.9 | 0.5 |
|  | Bonding layer on the side of supporting substrate | 94.3 | 5.4 | 0.3 | 93.8 | 6.0 | 0.2 |

TABLE 2

|  |  | Inventive example 1 | | | Inventive example 2 | | | Inventive example 3 | | | Inventive example 3-2 | | |
|---|---|---|---|---|---|---|---|---|---|---|---|---|---|
| Piezoelectric material substrate | | Lithium tantalate | | | Lithium tantalate | | | Lithium tantalate | | | Lithium tantalate | | |
| Supporting substrate | | Si | | | Si | | | Si | | | Si | | |
| FAB irradiation amount (kJ) | | 135 | | | 90 | | | 180 | | | 60 | | |
| Bonding strength (J/m2) | | 2.7 | | | 2.1 | | | 2.2 | | | 1.8 | | |
|  |  | Si | O | Ar | Si | O | Ar | Si | O | Ar | Si | O | Ar |
| Ratio of atoms atom % | Bonding layer on the side of Piezoelectric material substrate | 93.3 | 6.2 | 0.5 | 93.6 | 6.0 | 0.4 | 93.5 | 5.9 | 0.6 | 93.8 | 5.8 | 0.4 |
|  | Amorphous layer | 89.7 | 7.6 | 2.7 | 91.3 | 6.6 | 2.1 | 89.2 | 7.7 | 3.1 | 92.5 | 6.3 | 1.2 |
|  | Bonding layer on the side of supporting substrate | 93.2 | 6.2 | 0.6 | 93.7 | 5.9 | 0.4 | 93.5 | 5.9 | 0.6 | 93.8 | 5.8 | 0.4 |

The bonding strengths were proved to be low in both of the comparative examples 1 and 2.

According to the inventive examples 1, 2, 3 and 3-2, as the oxygen ratio and argon ratio of the amorphous layer were higher than the oxygen ratios and argon ratios of the first bonding layer and second bonding layer, respectively, the bonding strengths were considerably improved in the respective examples and the separation did not occur when the piezoelectric material substrate was polished. According to the inventive example 3-2, although the argon ratio of the amorphous layer was higher than the argon ratios of the first bonding layer and second bonding layer, respectively, the difference of the argon ratios was smaller than 1 atom % and the bonding strength was proved to be slightly lower compared with the inventive examples 1, 2 and 3.

Inventive Example 4 and Comparative Example 4

In the inventive example 1, the material of the supporting substrate was changed to sapphire and the FAB irradiation amount was also changed. The bonded bodies 8 and 8A were produced according to the same procedure as the inventive example 1 except them, and the oxygen ratios, argon ratios, and silicon ratios of the respective parts and the bonding strengths were measured. The results were shown in table 3.

TABLE 3

|  |  | Inventive example 4 | | | Comparative example 4 | | |
|---|---|---|---|---|---|---|---|
| Piezoelectric material substrate | | Lithium tantalate | | | Lithium tantalate | | |
| Supporting substrate | | Sapphire | | | Sapphire | | |
| FAB irradiation amount (kJ) | | 135 | | | 45 | | |
| Bonding strength (J/m2) | | 2.7 | | | 0.6 | | |
|  |  | Si | O | Ar | Si | O | Ar |
| Ratio of atoms atom % | Bonding layer on the side of piezoelectric material substrate | 93.5 | 6.2 | 0.3 | 93.7 | 6.2 | 0.1 |
|  | Amorphous layer | 89.6 | 7.8 | 2.6 | 93.3 | 6.2 | 0.5 |
|  | Bonding layer on the side of supporting substrate | 93.2 | 6.4 | 0.4 | 93.5 | 6.4 | 0.1 |

According to the comparative example 4, as the oxygen ratio of the amorphous layer was slightly lower than the oxygen ratio of the first bonding layer and same as the oxygen ratio of the second bonding layer, respectively, the bonding strength was proved to be low.

According the inventive example 4, as the oxygen ratio and argon ratio of the amorphous layer was higher than the oxygen ratios and argon ratios of the first bonding layer and second bonding layer, respectively, the bonding strength was considerably improved and the separation did not occur when the piezoelectric material substrate was polished.

Inventive Example 5 and Comparative Example 5

In the inventive example 1, the material of the supporting substrate was changed to cordierite and FAB irradiation amount was also changed. The bonded bodies 8 and 8A were produced according to the same procedure as the inventive example 1 except them, and the oxygen ratios, argon ratios, and silicon ratios of the respective parts and the bonding strengths were measured. The results were shown in table 4.

TABLE 4

|  |  | Inventive example 5 | | | Comparative example 5 | | |
|---|---|---|---|---|---|---|---|
| Piezoelectric material substrate | | Lithium tantalate | | | Lithium tantalate | | |
| Supporting substrate | | Cordierite | | | Cordierite | | |
| FAB irradiation amount (kJ) | | 135 | | | 45 | | |
| Bonding strength (J/m2) | | 2.6 | | | 0.5 | | |
|  |  | Si | O | Ar | Si | O | Ar |
| Ratio of atoms atom % | Bonding layer on the side of piezoelectric material substrate | 93.4 | 6.2 | 0.4 | 93.7 | 6.2 | 0.1 |
|  | Amorphous layer | 89.5 | 7.7 | 2.8 | 93.4 | 6.2 | 0.4 |
|  | Bonding layer on the side of supporting substrate | 93.2 | 6.3 | 0.5 | 93.7 | 6.2 | 0.1 |

According to the comparative example 5, as the oxygen ratio of the amorphous layer was same as the oxygen ratios of the first and second bonding layers, the bonding strength was proved to be low.

According to the inventive example 5, as the oxygen ratio and argon ratio of the amorphous layer was higher than the oxygen ratios and argon ratios of the first and second bonding layers, respectively, the bonding strength was considerably improved and the separation did not occur when the piezoelectric material substrate was polished.

Inventive Example 6 and Comparative Example 6

In the inventive example 1, the material of the supporting substrate was changed to sialon (z=2.5) and FAB irradiation amount was also changed. The bonded bodies 8 and 8A were produced according to the same procedure as the inventive example 1 except them, and the oxygen ratios, argon ratios, and silicon ratios of the respective parts and the bonding strengths were measured. The results were shown in table 5.

TABLE 5

|  |  | Inventive example 6 | | | Comparative example 6 | | |
|---|---|---|---|---|---|---|---|
| Piezoelectric material substrate | | Lithium tantalate | | | Lithium tantalate | | |
| Supporting substrate | | Sialon | | | Sialon | | |
| FAB irradiation amount (kJ) | | 135 | | | 45 | | |
| Bonding strength (J/m2) | | 2.7 | | | 0.7 | | |
|  |  | Si | O | Ar | Si | O | Ar |
| Ratio of atoms atom % | Bonding layer on the side of piezoelectric material substrate | 93.3 | 6.3 | 0.4 | 93.6 | 6.3 | 0.1 |
|  | Amorphous layer | 89.6 | 7.8 | 2.6 | 93.3 | 6.2 | 0.5 |
|  | Bonding layer on the side of supporting substrate | 93.2 | 6.2 | 0.6 | 93.7 | 6.2 | 0.1 |

According to the comparative example 6, as the oxygen ratio of the amorphous layer was same as the oxygen ratio of the first bonding layer and slightly lower than the oxygen ratio of the second bonding layer, respectively, the bonding strength was proved to be low.

According to the inventive example 6, as the oxygen ratio and argon ratio of the amorphous layer were proved to be higher than the oxygen ratios and argon ratios of the first and second bonding layers, respectively, the bonding strength was considerably improved and the separation did not occur when the piezoelectric material substrate was polished.

Inventive Example 7 and Comparative Example 7

In the inventive example 1, the material of the supporting substrate was changed to mullite and FAB irradiation amount was also changed. The bonded bodies 8 and 8A were produced according to the same procedure as the inventive example 1 except them, and the oxygen ratios, argon ratios, and silicon ratios of the respective parts and the bonding strengths were measured. The results were shown in table 6.

TABLE 6

|  |  | Inventive example 7 | | | Comparative example 7 | | |
|---|---|---|---|---|---|---|---|
| Piezoelectric material substrate | | Lithium tantalate | | | Lithium tantalate | | |
| Supporting substrate | | Mullite | | | Mullite | | |
| FAB irradiation amount (kJ) | | 135 | | | 45 | | |
| Bonding strength (J/m2) | | 2.5 | | | 0.7 | | |
|  |  | Si | O | Ar | Si | O | Ar |
| Ratio of atoms atom % | Bonding layer on the side of piezoelectric material substrate | 93.3 | 6.2 | 0.5 | 93.7 | 6.2 | 0.1 |
|  | Amorphous layer | 89.7 | 7.6 | 2.7 | 93.3 | 6.2 | 0.5 |
|  | Bonding layer on the side of supporting substrate | 93.2 | 6.2 | 0.6 | 93.7 | 6.2 | 0.1 |

According to the comparative example 7, as the oxygen ratio of the amorphous layer was same as the oxygen ratios of the first and second bonding layers, respectively, the bonding strength was proved to be low.

According to the inventive example 7, as the oxygen ratio and argon ratio of the amorphous layer were higher than the oxygen ratios and argon ratios of the first and second bonding layers, respectively, the bonding strength was considerably improved and the separation did not occur when the piezoelectric material substrate was polished.

Inventive Example 8 and Comparative Example 8

In the inventive example 1, the material of the supporting substrate was changed to translucent alumina and FAB irradiation amount was also changed. The bonded bodies 8 and 8A were produced according to the same procedure as the inventive example 1 except them, and the oxygen ratios, argon ratios, and silicon ratios of the respective parts and the bonding strengths were measured. The results were shown in table 7.

TABLE 7

| | | Inventive example 8 | | | Comparative example 8 | | |
|---|---|---|---|---|---|---|---|
| Piezoelectric material substrate | | Lithium tantalate | | | Lithium tantalate | | |
| Supporting substrate | | Translucent alumina | | | Translucent alumina | | |
| FAB irradiation amount (kJ) | | 135 | | | 45 | | |
| Bonding strength (J/m2) | | 2.6 | | | 0.6 | | |
| | | Si | O | Ar | Si | O | Ar |
| Ratio of atoms atom % | Bonding layer on the side of piezoelectric material substrate | 93.2 | 6.3 | 0.5 | 93.7 | 6.2 | 0.1 |
| | Amorphous layer | 89.6 | 7.6 | 2.8 | 93.5 | 6.1 | 0.4 |
| | Bonding layer on the side of supporting substrate | 93.2 | 6.2 | 0.6 | 93.7 | 6.2 | 0.1 |

According to the comparative example 8, as the oxygen ratio of the amorphous layer was slightly lower than the oxygen ratios of the first and second bonding layers, respectively, the bonding strength was proved to be low.

According to the inventive example 8, as the oxygen ratio and argon ratio of the amorphous layer were higher than the oxygen ratios and argon ratios of the first and second bonding layers, respectively, the bonding strength was considerably improved and the separation did not occur when the piezoelectric material substrate was polished.

The invention claimed is:

1. A bonded body comprising:
    a supporting substrate;
    a piezoelectric material substrate;
    a first bonding layer provided on said supporting substrate and having a composition of $Si_{(1-x)}O_x$ ($0.008 \leq x \leq 0.408$);
    a second bonding layer provided on said piezoelectric material substrate and having a composition of $Si_{(1-y)}O_y$ ($0.008 \leq y \leq 0.408$); and
    an amorphous layer provided between said first bonding layer and said second bonding layer,
    wherein an oxygen ratio of said amorphous layer is higher than an oxygen ratio of said first bonding layer and an oxygen ratio of said second bonding layer.

2. The bonded body of claim 1, wherein a difference of said oxygen ratio of said amorphous layer and of said oxygen ratio of said first bonding layer and a difference of said oxygen ratio of said amorphous layer and of said oxygen ratio of said second bonding layer are 0.5 atom % or larger, respectively.

3. The bonded body of claim 1, wherein an argon ratio of said amorphous layer is higher than an argon ratio of said first bonding layer and an argon ratio of said second bonding layer.

4. The bonded body of claim 3, wherein a difference of said argon ratio of said amorphous layer and of said argon ratio of said first bonding layer and a difference of said argon ratio of said amorphous layer and of said argon ratio of said second bonding layer are 1 atom % or larger, respectively.

5. The bonded body of claim 1, wherein a material of said supporting substrate is selected from the group consisting of silicon, sialon, sapphire, cordierite, mullite and alumina.

6. The bonded body of claim 1, wherein a material of said piezoelectric material substrate is selected from the group consisting of lithium niobate, lithium tantalate and lithium niobate-lithium tantalate solid solution.

7. The bonded body of claim 1, further comprising an intermediate layer provided between said supporting substrate an said first bonding layer.

8. The bonded body of claim 1, further comprising an intermediate layer provided between said piezoelectric material substrate and said second bonding layer.

9. An acoustic wave device comprising:
    said bonded body of claim 1; and
        an electrode provided on said piezoelectric material substrate.

* * * * *